(12) United States Patent
Kim et al.

(10) Patent No.: US 7,659,735 B2
(45) Date of Patent: Feb. 9, 2010

(54) PROBE CARD CAPABLE OF MULTI-PROBING

(76) Inventors: Min-gu Kim, 526-1404, Jinsen Mauel Samsung, 5-cha Apt., Fungdockcheon-dong, Suji-gu, Yongin-si, Gyeonggi-do (KR); Ho-jeong Choi, 521-804, Samsung 5-cha Apt., Fungdockcheon 2-dong, Suji-gu, Yongin-si, Gyeonggi-do (KR); Young-soo An, 102-1503, Mudeung LG 2-cha Apt., Mabuk-dong, Gibeung-gu, Yongin-si, Gyeonggi-do (KR)

( * ) Notice: Subject to any disclaimer, the term of this patent is extended or adjusted under 35 U.S.C. 154(b) by 188 days.

(21) Appl. No.: 11/646,014

(22) Filed: Dec. 27, 2006

(65) Prior Publication Data
US 2007/0152688 A1    Jul. 5, 2007

(30) Foreign Application Priority Data
Dec. 29, 2005   (KR) .................... 10-2005-0133419

(51) Int. Cl.
   *G01R 31/02* (2006.01)
(52) U.S. Cl. .................... 324/754; 324/761
(58) Field of Classification Search .............. None
   See application file for complete search history.

(56) References Cited

U.S. PATENT DOCUMENTS

| | | | | | |
|---|---|---|---|---|---|
| 4,956,602 | A | * | 9/1990 | Parrish | 324/537 |
| 5,070,297 | A | * | 12/1991 | Kwon et al. | 324/754 |
| 5,124,660 | A | * | 6/1992 | Cilingiroglu | 324/538 |
| 5,555,422 | A | * | 9/1996 | Nakano | 324/754 |
| 6,407,566 | B1 | * | 6/2002 | Brunelle et al. | 324/758 |
| 6,456,099 | B1 | * | 9/2002 | Eldridge et al. | 324/754 |
| 6,690,185 | B1 | * | 2/2004 | Khandros et al. | 324/758 |

FOREIGN PATENT DOCUMENTS

| | | |
|---|---|---|
| JP | 2001-183392 | 7/2001 |
| KR | 1998-021866 | 7/1998 |
| KR | 2000-0008954 | 5/2000 |

* cited by examiner

*Primary Examiner*—Vinh P Nguyen
(74) *Attorney, Agent, or Firm*—Mills & Onello, LLP (57) ABSTRACT

A probe card capable of multi-probing includes a print circuit board having a plurality of contact portions and a test module having a plurality of test boards. Each of the test boards includes at least one probing portion on which a plurality of needles are arrayed. The test module selects one of the test boards and probes semiconductor chips formed on a semiconductor wafer through the needles arrayed on the probing portion of the selected test board.

12 Claims, 6 Drawing Sheets

FIG. 6B

PROBE CARD CAPABLE OF MULTI-PROBING

CROSS-REFERENCE TO RELATED PATENT APPLICATION

This application claims the benefit of Korean Patent Application No. 10-2005-0133419, filed on Dec. 29, 2005, in the Korean Intellectual Property Office, the contents of which are incorporated herein in their entirety by reference.

BACKGROUND OF THE INVENTION

1. Field of the Invention

The present invention relates to a probe card for testing a semiconductor integrated circuit, and more particularly, to a probe card capable of multi-probing.

2. Description of the Related Art

Generally, a semiconductor device is fabricated through a series of processes such as a process for fabricating a semiconductor wafer, a process for forming a plurality of unit semiconductor chips on the semiconductor wafer, a process for electrically testing the semiconductor chips to determine whether the semiconductor chips are defective, a process for packaging the semiconductor chips, and a process for finally testing the packaged semiconductor chips. The electrical element test and electrical die-sorting test are performed to determine whether the semiconductor chips formed on the semiconductor wafer are electrically defective. In order to perform these tests, a test apparatus for determining whether a semiconductor chip formed on the semiconductor wafer is defective is used.

A typical test apparatus includes a tester for generating an electric signal and a probe card for transmitting the electric signal from the tester to a bonding pad formed on a semiconductor chip. A plurality of needles are installed on the probe card. The probe card transmits the electric signal generated by the tester to the semiconductor wafer or transmits the electric signal from the semiconductor wafer to the tester through the needle contacting the semiconductor wafer. The probe card may be classified as a single type probe card for probing the semiconductor chips formed on the semiconductor wafer one-by-one or a parallel type probe card (a multi-type probe card) for simultaneously probing multiple, e.g., four, eight, sixteen, semiconductor chips adjacent one another.

Figure 1:
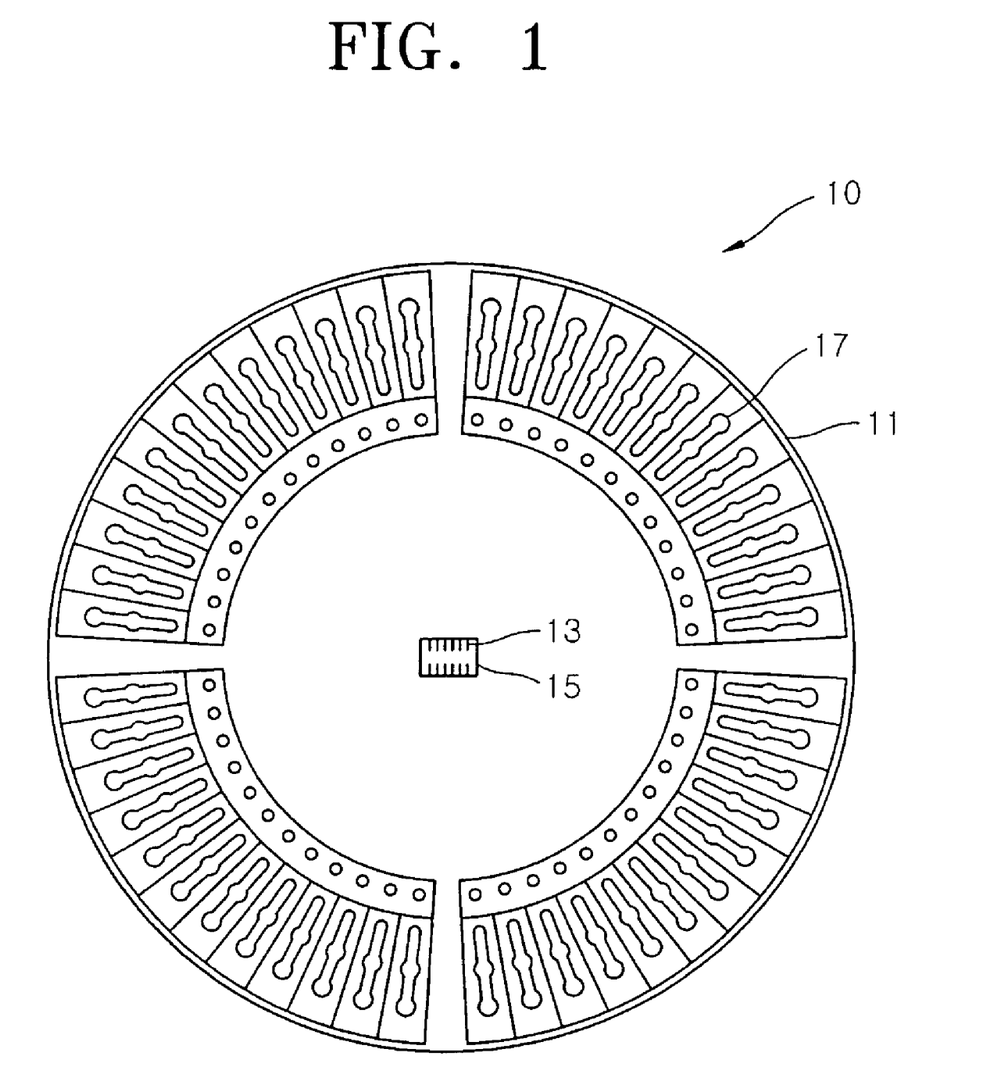
FIG. 1 is a schematic view of a probe card according to the related art.

FIG. 1 is a schematic view of a single type probe card according to the related art.

Referring to FIG. 1, a single type probe card 10 includes a printed circuit board (PCB) 11. An array of contact portions 17 for electrically contacting a test pin of a tester is formed on the PCB 11. The PCB 11 has a probing part 15 formed through a central portion. A plurality of needles 13 electrically contacting the contact portions 17 by an internal wire (not shown) are arrayed on the probing portion 15. Since the single type probe card tests the semiconductor chips one-by-one, an accurate test can be realized. However, when testing a large number of semiconductor chips formed on the semiconductor wafer one at a time, a prolonged test time is required, thereby degrading the yield and productivity. In the case of the multi-type probe card, since it is possible to test many semiconductor chips at the same time, the test time can be reduced and the productivity can be improved. However, the test accuracy is not ensured. Furthermore, the probe cards of the related art are designed to probe predetermined type of semiconductor chips. Therefore, in order to probe other types of semiconductor chips, the current probe card must be replaced. This can be time consuming and inefficient.

SUMMARY OF THE INVENTION

The present invention provides a probe card that can probe different types of semiconductor chips using different probing methods.

According to an aspect of the present invention, there is provided a probe card capable of multi-probing, including: a printed circuit board (PCB) having a plurality of contact portions disposed on a first surface thereof; and a test module having a plurality of test boards, wherein each of the test boards includes at least one probing portion on which a plurality of needles are arrayed and the test module selects one of the test boards and probes semiconductor chips formed on a semiconductor wafer through the needles arrayed on the probing portion of the selected test board.

The probe portions of the test boards may be different in an array configuration from each other and the probe portions of the test boards may be identical in a needle array configuration to each other or partly different in the needle array configuration from each other. Alternatively, the probe portions of the test boards may be identical in an array configuration to each other and different in a needle array configuration from each other.

The test boards may be interlocked and, when one of the test boards is selected, the selected test board may contact the first surface of the PCB through the contact portions and other test boards that are not selected may not contact the first surface of the PCB.

There may be a predetermined difference between a distance from a second surface of the PCB, which is opposite to the first surface, to extreme ends of the needles arrayed on the probing portion of the selected test board and a distance from the second surface of the PCB to extreme ends of the needles arrayed on the probing portions of the test boards that are not selected. The predetermined difference may be about 5 mm.

According to another aspect of the present invention, there is provided a probe card capable of multi-probing, including: a PCB having a plurality of contact portions disposed on a first surface thereof; a test module having a plurality of test boards each having at least one probing portion on which a plurality of needles are arrayed, the test board being provided at a side surface with an insertion groove; and a fixing member for fixing each test board and disposed on the first surface of the PCB.

Each of the test boards may be formed in the form of a push button moving up and down in a vertical direction to the PCB.

The probe card may further include an elastic member disposed between the PCB and each of the test boards to bias the test board upward in the vertical direction to the PCB. The elastic member may be formed of a spring.

The fixing member may include a locking member formed on a surface facing the side surface of the test board on which the insertion groove is formed. The locking member may be disposed between the PCB and the test board to be movable leftward and rightward and include a projection that is inclined at it goes from the test board toward the PCB. When one of the test boards is selected, the locking member may be inserted in the insertion groove of the selected test board to allow the selected test board to contact the PCB through the contact portions while the test boards that are not selected may be biased by the elastic members so as not to contact the PCB.

There may be a predetermined difference between a distance from a second surface of the PCB, which is opposite to the first surface, to extreme ends of the needles arrayed on the probing portion of the selected test board and a distance from the second surface of the PCB to extreme ends of the needles arrayed on the probing portions of the test boards that are not selected. The predetermined difference may be about 5 mm.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully with reference to the accompanying drawings, in which exemplary embodiments of the invention are shown. It will be understood that when a layer is referred to as being "on" another layer or substrate, it can be directly on the other layer or substrate, or intervening layers may also be present. Like reference numerals in the drawings denote like elements, and thus their description will not be repeated.

Figure 2:
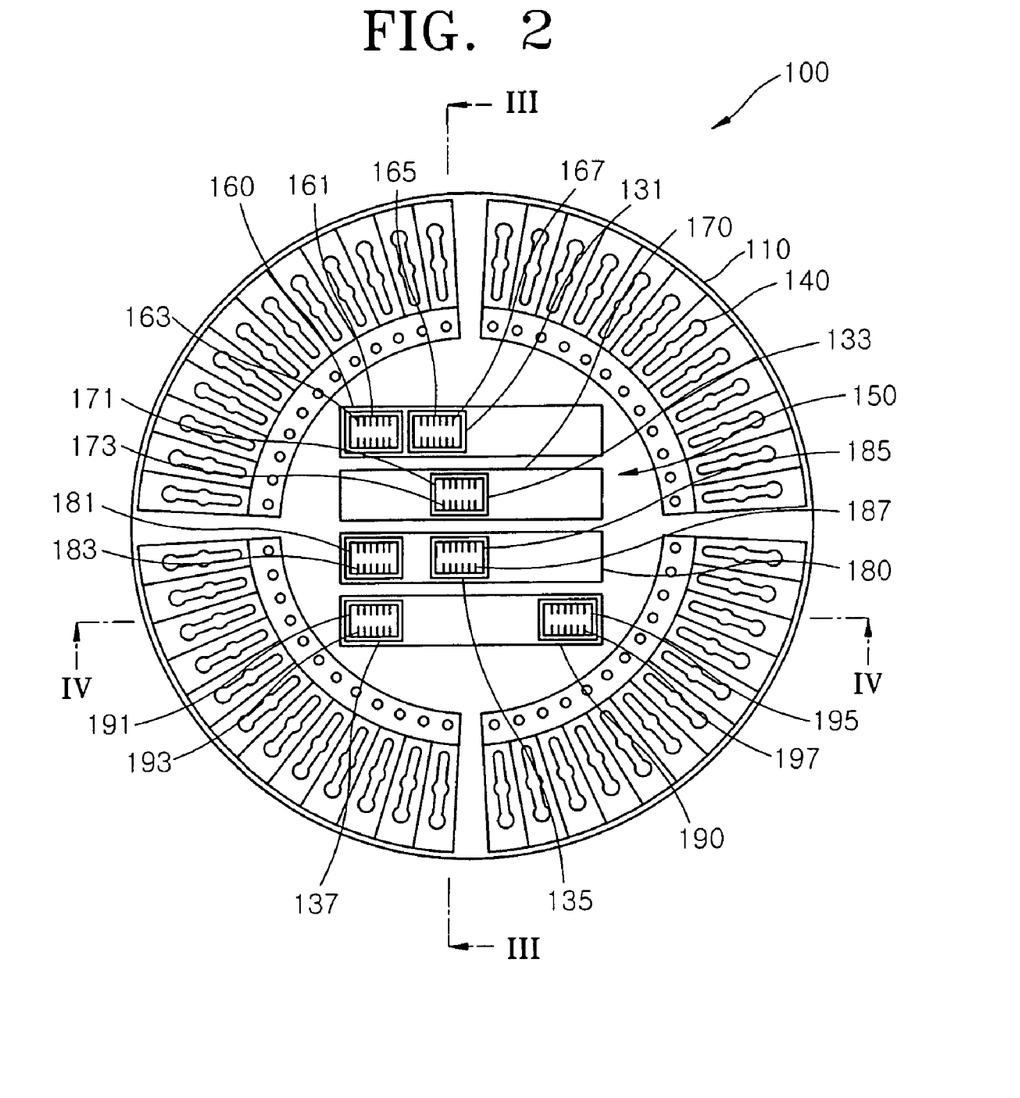
FIG. 2 is a schematic top view of a probe card capable of multi-probing according to an embodiment of the present invention.

FIG. 2 is a schematic top view of a probe card capable of multi-probing according to an embodiment of the present invention. Referring to FIG. 2, a probe card 100 includes a PCB 110 and a test module 150 for probing different types of semiconductor chips using different methods. The test module 150 includes a plurality of test boards, for example, first, second, third, and fourth test boards 160, 170, 180, and 190 for probing the different types of semiconductor chips using the different methods. The PCB 110 is formed in, for example, a disk-shape and a plurality of contact portions 140 formed of Cu are arrayed on a surface of the PCB 110. The contact portions 140 contact a test pin of a tester (not shown) for testing the semiconductor chips. The test module 150 is arrayed on a central portion of the PCB 110.

The first test board 160 probes two adjacent semiconductor chips at a time through a /1;2 mapping probing method. The first test board 160 includes two probing portions 161 and 165 adjacent to each other to probe the two adjacent semiconductor chips. The probing portions 161 and 165 are formed in, for example, a rectangular through hole shape. A plurality of needles 163 and 167 contacting a bonding pad (not shown) of the semiconductor chips are arrayed around the probing portions 161 and 165. The needles 163 and 167 are electrically connected to the contact portion 140 through an inner wire (not shown) of the PCB 110.

The contact portion 140 of the PCB 110 electrically contacts the test pin of the tester and the needles 163 and 167 are electrically connected to the bonding pad of the semiconductor chips. Since the tester is electrically connected to the two adjacent semiconductor chips through the first test board 160, the tester can simultaneously test the two adjacent semiconductor chips formed on the semiconductor wafer.

The second test board 170 tests the semiconductor chips formed on the semiconductor wafer one-by-one through an all-mapping probing method. The operation of the second test board 170 is identical to that of the single type probe card of the related art. That is, the second test board 170 includes a probing portion 171. The probing portion 171 is formed in, for example, a rectangular through hole shape. A plurality of needles 173 contacting the bonding pad of the semiconductor chip are arrayed around the probing portion 171. The needles 173 are electrically connected to the contact portion 140 through the internal wire (not shown) of the PCB 110.

The contact portion 140 of the PCB 110 electrically contacts the test pin of the tester and the needles 173 are electrically connected to the bonding pad of the semiconductor chip. Since the tester is electrically connected to the semiconductor chips through the second test board 170 of the probe card 100, like the single type probe card of the related art, the tester tests the electrical properties of the semiconductor chips one-by-one.

In addition, the third test board 180 is provided to test 12-point per semiconductor wafer. That is, the third test board 180 includes two probing portions 181 and 185. A plurality of needles 183 and 187 contacting the bonding pad (not shown) of the semiconductor chips are arrayed around the probing portions 181 and 185. The needles 183 and 187 are electrically connected to the contact portion 140 through the inner wire (not shown) of the PCB 110. Since the contact portion 140 of the PCB 110 electrically contacts the test pin of the tester and the needles 183 and 187 are electrically connected to the bonding pad of the semiconductor chips, the tester tests the electrical properties of the semiconductor chips through the third test board.

The fourth test board 190 is provided to probe one of four semiconductor chips arrayed in a line through a 4-para probing method. The fourth test board 190 includes two probing portions 191 and 195 spaced apart from each other. Each of the probing portions 191 and 195 probes every four semiconductor chips one-by-one. The probing portions 191 and 195 are formed in, for example, a rectangular through hole shape. A plurality of needles 193 and 197 contacting the bonding pad (not shown) of the semiconductor chips are arrayed around the probing portions 191 and 195. The needles 193 and 197 are electrically connected to the contact portion 140 through the inner wire (not shown) of the PCB 110.

The contact portion 140 of the PCB 110 electrically contacts the test pin of the tester and the needles 193 and 197 are electrically connected to the bonding pad of the semiconductor chips. Since the tester is electrically connected to the two semiconductor chips spaced apart through the fourth test board 190, the tester can simultaneously test the electrical property of one of the every four semiconductor chips.

Figure 3:
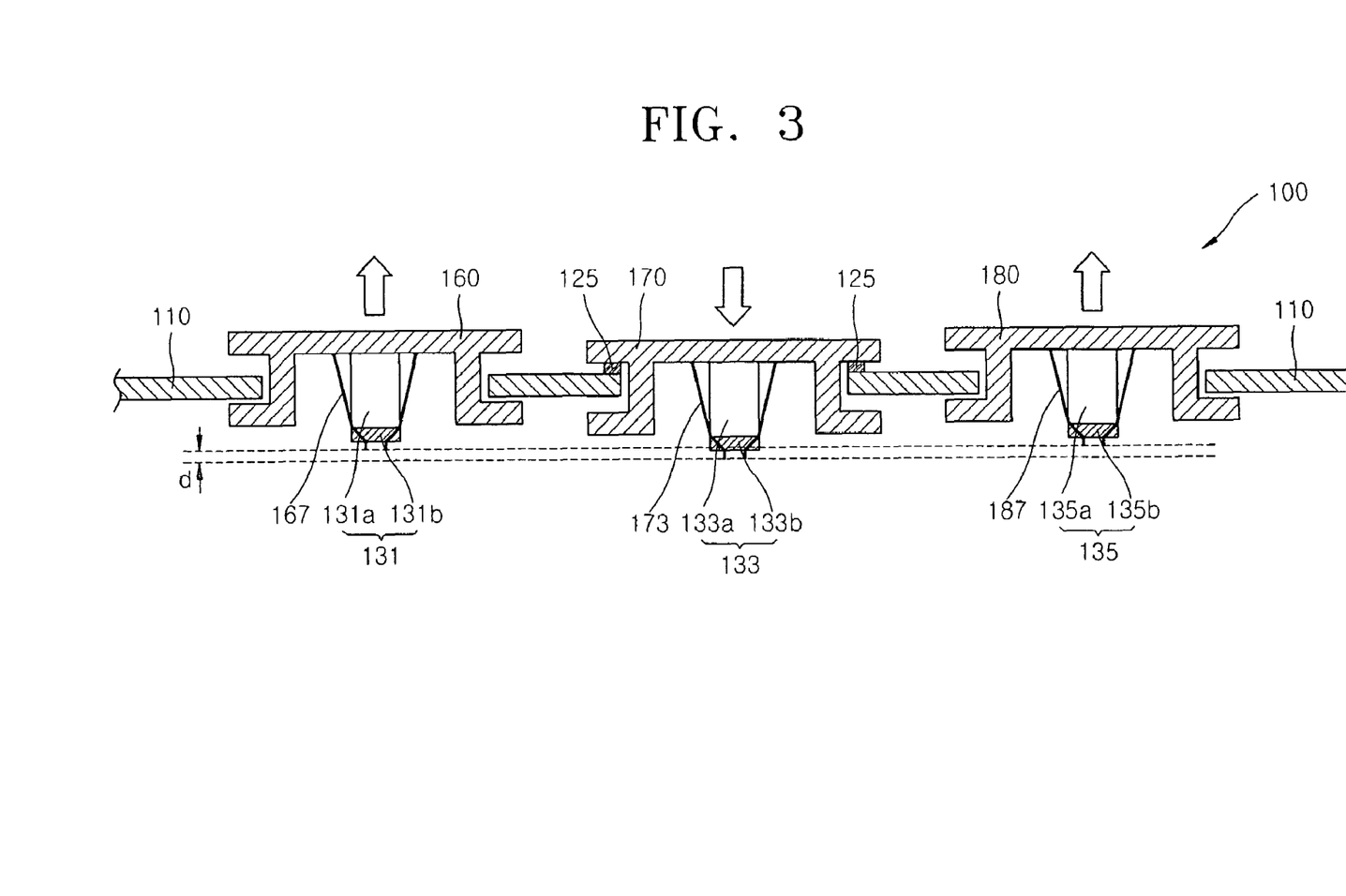
FIG. 3 is a schematic sectional view taken along line III-III of FIG. 2.
Figure 4:
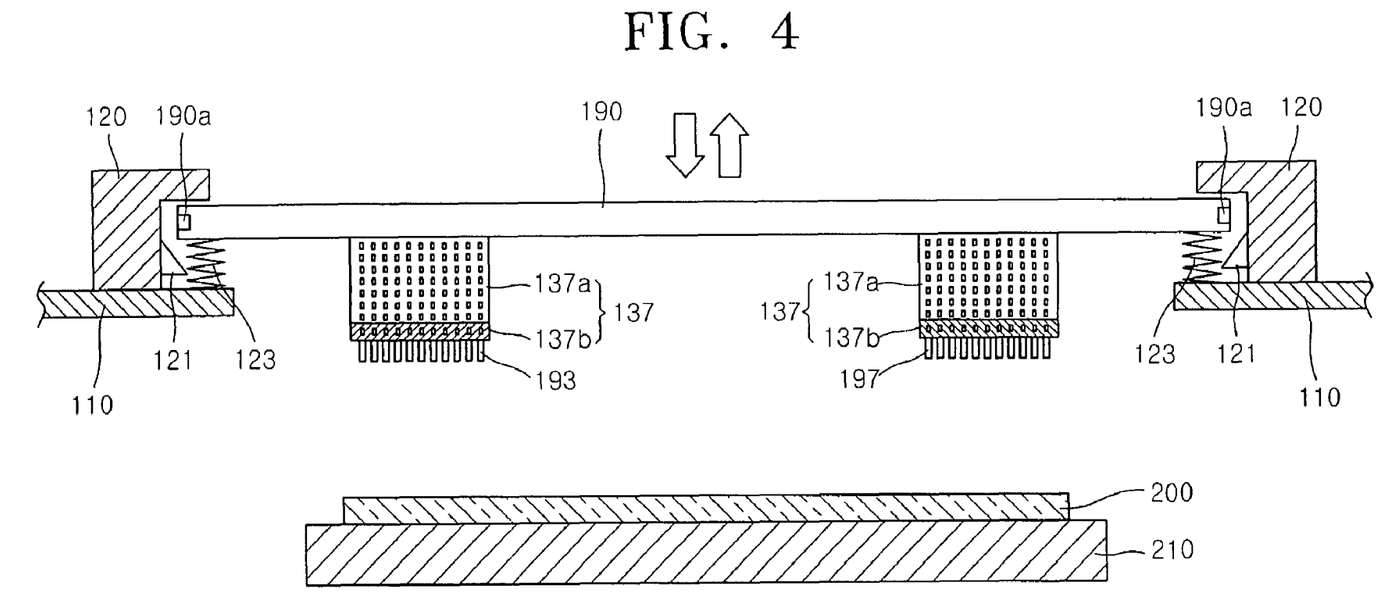
FIG. 4 is a schematic sectional view taken along line IV-IV of FIG. 2.

The probe card 100 further includes supporting members 131, 133, 135, and 137 for stably supporting the needles 163 and 167, 173, 183 and 187, and 193 and 197 arrayed on the probing portions 161 and 165, 171, 181 and 185, and 191 and 195 of the test boards 160, 170, 180, and 190, respectively. The supporting members 131, 133, 135, and 137 are arrayed on surfaces of the test boards along the probing portions, respectively. Referring to FIGS. 3 and 4, each of the supporting members 131, 133, 135, and 137 includes a ceramic layer (131a, 133a, 135a, or 137a) and an epoxy layer (131b, 133b, 135b, or 137b).

In the above-described probe card 100, the test module 150 includes the four test boards to probe different types of the semiconductor chips using different probing methods. For example, the first test board 160 may be applied to map DRAM semiconductor chips by ½ and probe the same, the second test board 170 may be applied to map all of SRAM semiconductor chips, the third test board 180 may be applied for the 12-point probing of FLASH semiconductor chips, and the fourth test board 190 may be applied for the 4-para probing of PRAM semiconductor chips.

Figure 6A:
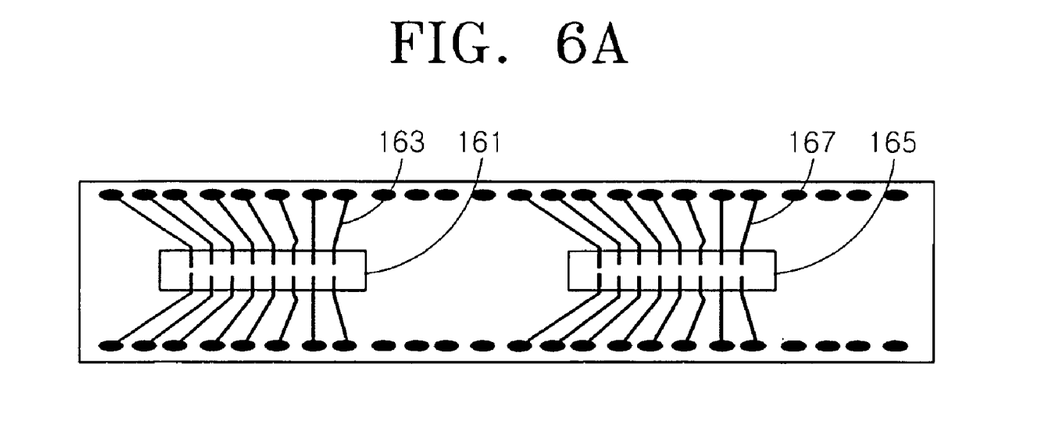
FIGS. 6A and 6B are schematic top views of a probing portion of a probe card depicted in FIG. 2.
Figure 6B:
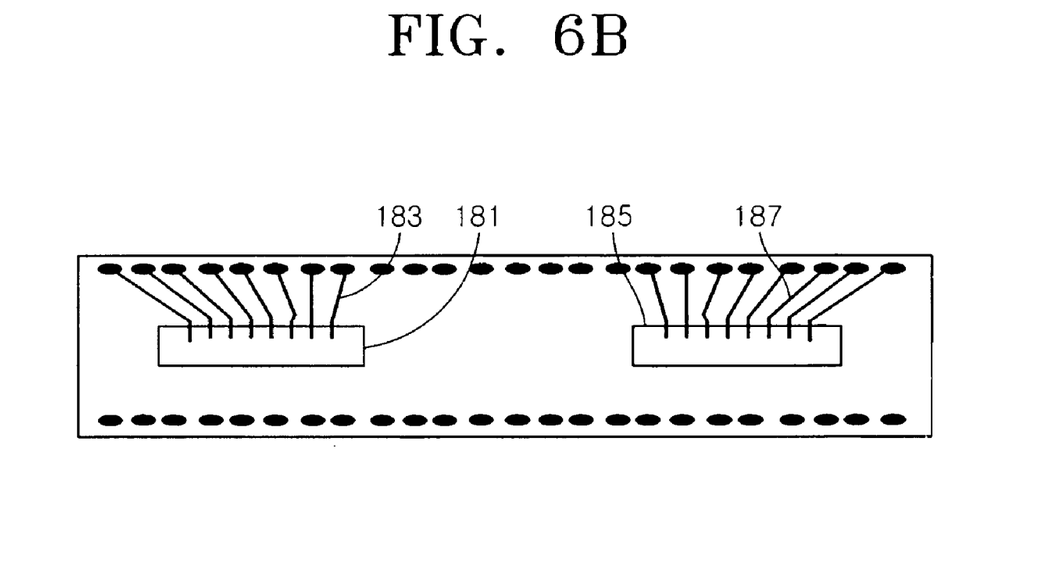

In this case, the needles may be arrayed in a variety of configurations on the probing portions to properly test the semiconductor chips for the corresponding test boards 160, 170, 180, and 190. In the drawing, although the needles for the corresponding test boards 160, 170, 180, and 190 are arrayed in an identical configuration, they may be partly arrayed in a different configuration. For example, the probing portions 161 and 165 of the first test board 160 may have a drop-in type needle array configuration as shown in FIG. 6A and the probing portions 171 and 175 of the third test board 180 may have a scribe line type needle array configuration as shown in FIG. 6B. In addition, the probing portions of the second and fourth test boards 170 and 190 may have needle array configurations different from the above configurations.

Alternatively, the probing portions of the first and third test boards 160 and 180 may have the drop-in type needle array configuration and the second and fourth test boards 170, 190 may have the scribe line type needle array configuration. In addition, the first, second, third, fourth test boards may be identical in the needle array configuration to each other. In this case, the needle array configurations for the corresponding test boards may be different in a size of the needle and a pitch between the adjacent needles from each other.

The structure of the probe card is not limited to the above-described structure. That is, the test boards 160, 170, 180, and 190 of the test module 150 may be formed in a variety of configurations to test different types of semiconductor chips using different test methods. The first, second, third, and fourth test boards 160, 170, 180, and 190 may be applied to test one chip of semiconductor chips such as the DRAM, SRAM, FLASH, or PRAM semiconductor chips. In this case, different probing methods may be applied. In addition, using the first, second, third, and fourth test boards 160,170, 180, and 190, it is possible to probe the DRAM semiconductor chips through the ½ mapping, all-mapping, 12-point, or 4-para probing method. Alternatively, the first and second test boards 160 and 170 may probe the DRAM semiconductor chips using the ½ mapping or all-mapping probing method while the third and fourth test boards 180 and 190 may probe the SRAM semiconductor chips using the 12-point or 4-para probing method.

FIG. 3 is a sectional view taken along line III-III of FIG. 2 to illustrate the test module of the probe card. Referring to FIG. 3, there are shown only the first, second and third test modules 160, 170 and 180. One selected test board, for example, the second test board 170 of the test module 150 contacts the PCB 110 through a contact point 125 and other two test boards, for example, the first and third test boards 160 and 180, which are not selected, do not contact the PCB 110.

Accordingly, only the needles 173 and 177 formed on the probing portions 171 and 175 of the second test board 170 are electrically connected to the bonding pad (not shown) of the semiconductor chips formed on the semiconductor wafer 200 disposed on a stage (210 of FIG. 4). Thus, a test signal is transmitted from the tester to the semiconductor chips through the second test board 170 of the test module 150 of the probe card 100. An electrical signal from the semiconductor chips is transmitted to the tester through the selected second test board 170. The tester determines according to the transmitted electric signal whether the semiconductor chips are defective.

FIG. 4 is a sectional view taken along line IV-IV of FIG. 2 to illustrate the test module of the probe card. Referring to FIG. 4, there is shown only the fourth test board 190 among the first through fourth test boards 160, 170, 180, 190 of the test module 150. The test module 150 includes a fixing member 120 for fixing the fourth test board 190 of the test module 150. The fixing member 120 that is installed on a first surface of the PCB 110, where the contact portions 125 are disposed, includes a locking member 121 for locking the test board 190. The locking member 121 is disposed between the PCB 110 and the fourth test board to be movable between a central portion of the PCB 110 and an edge portion of the PCB 110. The locking member 121 has a projection inclined as it goes from the fourth test board 190 toward the PCB 110.

The fourth test board 190 has an insertion groove 190a formed on a side surface thereof. The locking member 121 of the fixing member 120 is inserted in the insertion groove 190a so that the fourth test board 190 can be fixed on the PCB 110 by the fixing member 120. The fourth test board 190 moves in a vertical direction to the PCB 110.

The test module 150 further includes an elastic member 123 disposed between the fourth test board 190 and the PCB 110. The elastic member 123 may be formed of a spring to bias the fourth test board 190 upward. When the locking member 121 is unlocked from the insertion groove 190a of the fourth test board 190, the elastic member 123 vertically moves the fourth test board 190 upward in the vertical direction to the PCB 110.

Similarly, the first to third test boards 160, 170, 180 have the insertion grooves, where the locking member 121 of the fixing member 120 is inserted, so that they are fixed on the PCB 110 by the fixing member 120. The elastic members are disposed between the first to third test board 190 and the PCB 110.

Figure 5A:
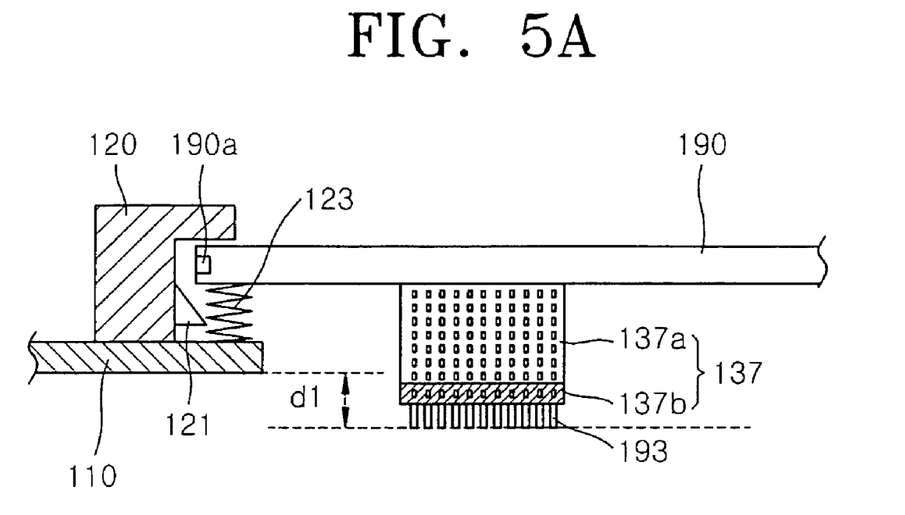
FIGS. 5A and 5B are sectional views illustrating a process for selecting or non-selecting a test board of a test module in a probe card depicted in FIG. 2.
Figure 5B:
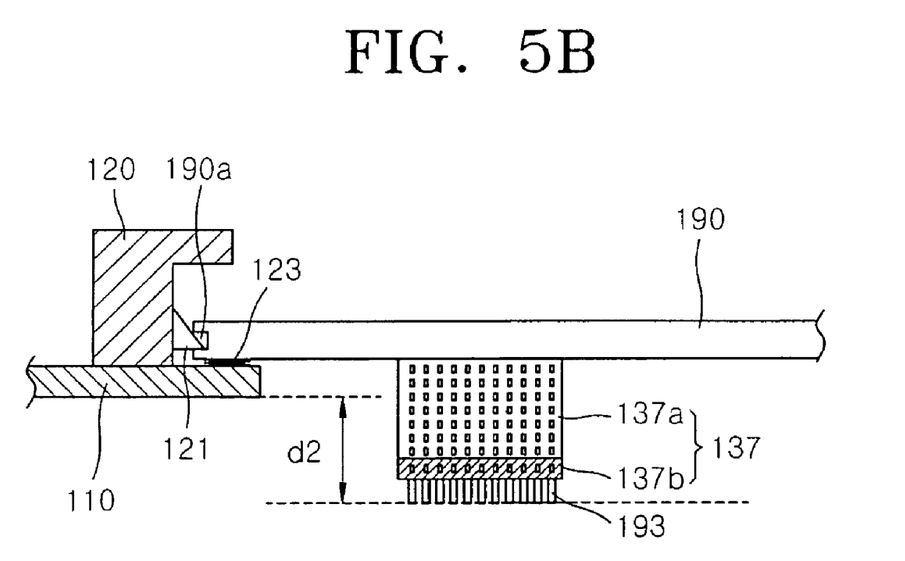

FIGS. 5A and 5B are sectional views illustrating a process for locking and unlocking the fourth test board 190 on the locking member 121 of the fixing member 120. The fourth test board 190 will be used as an example to describe the locking and unlocking processes. First, when the fourth test board 190 is not selected, no downward force is applied to the fourth test board 190. Therefore, as shown in FIG. 5A, the fourth test board 190 is disposed at a predetermined height from the PCB 110 by the elastic member 123 and fixed by the fixing member 120. When the fourth test board 190 is selected, a downward force is applied to the fourth test board 190. As a result, as shown in FIG. 5B, the locking member 121 of the fixing member 120 is fixedly inserted in the insertion groove 190a of the test board 190.

At this point, when a distance between a second surface of the PCB 110, which is opposite to the first surface, to an extreme end of the needle 193 is d1 in a stat where the fourth test board 190 is not selected and a distance from the second surface of the PCB 110 to the extreme end of the needle 193 is d2 in a state where the fourth test board 190 is selected, the projection 121 and the elastic member 123 may be installed such that a difference d (FIG. 3) between d2 and d1 can be 5 mm to prevent the malfunction and damage of the needle 185.

Although the fourth test board 190 is used as an example in the above description, the first, second and third test board 160, 170 and 180 are identically fixed on the fixing member 120. The first, second, third and fourth test boards 160, 170, 180 and 190 are formed in the form of a push button and interlocked with each other. When one of the test boards 160, 170, 180, 190 of the module 150 is selected, for example, when the fourth test board 190 is selected, the fourth test board 190 may be manually pressed downward. In this case, the locking member 121 of the fixing member 120 is locked in the insertion groove 190a. Therefore, the selected fourth test board 190 moves downward to be fixed on the locking member 121 of the fixing member 120, thereby contacting the fourth test board 190 with the PCB 110 through the contact point 125 as shown in FIG. 3.

On the contrary, for the first, second and third test boards 160, 170 and 180 that are not selected, each locking member 121 moves from the central portion of the PCB 110 to the edge portion of the PCB 110 and thus each test board automatically moves upward by each elastic member 123. Therefore, since the first, second and third test boards 160, 170 and 180 that are not selected moves upward from the PCB 110 by the elastic members 123, thereby not contacting the PCB 110 as shown in FIG. 3.

In this state, when the second test board 170 is selected and pressed, the locking member 121 of the fixing member 120 is inserted in the insertion groove 190a of the second test board 170 to allow the second test board 170 to contact the PCB 110 through the contact point 125. In addition, the locking members 121 of the first, third and fourth test boards 160, 180 and 190 that are not selected are unlocked from the insertion grooves 190a and automatically move upward by the elastic members 123, thereby not contacting the PCB 110.

As described above, since the plurality of test boards 160, 170, 180 and 190 of the test module are interlocked such that only a selected one of the test boards can contact the PCB 110 and other test boards that are not selected do not contact the PCB 110, it becomes possible to test desired semiconductor chips through a desired probing method using a single probe card.

According to the present invention, since the inventive probe card can test different types semiconductor chips using different probing methods, it can be flexibly applied to test a variety of types of semiconductor chips or pads, thereby reducing the manufacturing costs and improving the productivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A probe card capable of multi-probing, comprising:
a PCB having a plurality of contact portions disposed on a first surface thereof;
a test module having a plurality of test boards each having at least one probing portion on which a plurality of needles are arrayed, the test board being provided at a side surface with an insertion groove, the plurality of needles in each of the test boards being contacted with the plurality of contact portions of the PCB;
a fixing member for fixing each test board and disposed on the first surface of the PCB; and
an elastic member disposed between the PCB and each of the test boards to bias the test board upward in the vertical direction with respect to the PCB.

2. The probe card of claim 1, wherein each of the test boards is formed in the form of a push button moving in a vertical direction to the PCB.

3. The probe card of claim 2, wherein the probing portions of the test boards are identical in a needle array configuration to each other or partly different in the needle array configuration from each other.

4. The probe card of claim 1, wherein the elastic member comprises a spring.

5. The probe card of claim 1, wherein the fixing member includes a locking member formed on a surface facing the side surface of the test board on which the insertion groove is formed.

6. The probe card of claim 5, wherein when one of the test boards is selected, the locking member is inserted in the insertion groove of the selected test board to allow the selected test board to contact the PCB through the contact portions while the test boards that are not selected are biased by the elastic members so as not to contact the PCB.

7. The probe card of claim 5, wherein the locking member is disposed between the PCB and the test board to be movable leftward and rightward.

8. The probe card of claim 7, wherein the locking member includes a projection that is inclined as it goes from the test board toward the PCB.

9. The probe card of claim 1, wherein there is a predetermined difference between a distance from a second surface of the PCB, which is opposite to the first surface, to extreme ends of the needles arrayed on the probing portion of the selected test board and a distance from the second surface of the PCB to extreme ends of the needles arrayed on the probing portions of the test boards that are not selected.

10. The probe card of claim 9, wherein the predetermined difference is about 5 mm.

11. The probe card of claim 1, wherein the probing portions of the test boards are different in an array configuration from each other.

12. The probe card of claim 1, wherein the probing portions of the test boards are identical in an array configuration to each other and different in a needle array configuration from each other.

* * * * *

UNITED STATES PATENT AND TRADEMARK OFFICE
CERTIFICATE OF CORRECTION

PATENT NO.       : 7,659,735 B2  Page 1 of 1
APPLICATION NO. : 11/646014
DATED            : February 9, 2010
INVENTOR(S)      : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 232 days.

Signed and Sealed this

Thirtieth Day of November, 2010

David J. Kappos
*Director of the United States Patent and Trademark Office*